US008031883B2

(12) United States Patent
Bai et al.

(10) Patent No.: US 8,031,883 B2
(45) Date of Patent: Oct. 4, 2011

(54) CROSSTALK CANCELLATION SYSTEM WITH SOUND QUALITY PRESERVATION AND PARAMETER DETERMINING METHOD THEREOF

(75) Inventors: Ming-Sian Bai, Hsinchu (TW); Yo-Chung Liu, Jhubei (TW); Kuen-Ying Ou, Taichung (TW); Geng-Yu Shih, Tainan (TW); Chih-Chung Lee, Dali (TW)

(73) Assignee: Sunplus Technolgoy Co., Ltd., Hsinchu (TW)

( * ) Notice: Subject to any disclaimer, the term of this patent is extended or adjusted under 35 U.S.C. 154(b) by 1245 days.

(21) Appl. No.: 11/714,793

(22) Filed: Mar. 7, 2007

(65) Prior Publication Data

US 2007/0223750 A1 Sep. 27, 2007

(30) Foreign Application Priority Data

Mar. 9, 2006 (TW) ................................ 95107937 A

(51) Int. Cl.
*H03G 5/00* (2006.01)
*H04R 5/02* (2006.01)
*H04R 5/00* (2006.01)

(52) U.S. Cl. ............ 381/99; 381/309; 381/303; 381/17; 381/18

(58) Field of Classification Search ................ 381/1, 26, 381/309, 99, 17–19, 303, 307
See application file for complete search history.

(56) References Cited

U.S. PATENT DOCUMENTS 4,975,954 A * 12/1990 Cooper et al. .................. 381/26

* cited by examiner

*Primary Examiner* — Devona Faulk
*Assistant Examiner* — George Monikang
(74) *Attorney, Agent, or Firm* — Bacon & Thomas, PLLC

(57) ABSTRACT

A crosstalk cancellation system for preserving quality of sound and the parameter determining method thereof. The system can cancel a two-channel audio signal without compensating a frequency response of an ipsilateral HRTF. The method includes providing an audio signal input device for inputting the two-channel audio signal, modeling a relation between parameters of the crosstalk cancellation system and a head related transfer function (HRTF) to thereby obtain an output transfer impulse response, setting contralateral parts of the output transfer impulse response approximate to zero, setting ipsilateral parts of the output transfer impulse response equal to a delay of ipsilateral head related impulse responses (HRIRs) corresponding to the HRTF, and performing an inverse operation to compute the parameters of the crosstalk cancellation system.

14 Claims, 9 Drawing Sheets

CROSSTALK CANCELLATION SYSTEM WITH SOUND QUALITY PRESERVATION AND PARAMETER DETERMINING METHOD THEREOF

BACKGROUND OF THE INVENTION

1. Field of the Invention

The invention relates to the technical field of crosstalk cancellation and, more particularly, to a crosstalk cancellation system for preserving quality of sound and a parameter determining method thereof.

2. Description of Related Art

In acoustics, typical crosstalk cancellation systems play an important role when speakers are applied to a 3D sound reproduction. The typical crosstalk cancellation systems are mainly aimed at cancelling the crosstalk, and compensating and equalizing ipsilateral head related transfer function (HRTF) parts. However, for compensating the poor low-frequency and high-frequency response of HRTF, the typical crosstalk cancellation systems require larger gains, which cause the effect of crosstalk amplification in low-frequency and high-frequency bands and further produce high-frequency noises and distortion. In addition, when the ipsilateral HRTF parts are overcompensated, a reproduced field tone is easily and significantly changed, and thus the quality of tone is poor.

The typical crosstalk cancellation systems have a feature corresponding to the character of a speaker. Namely, different speaker working modules require redesigning the respective crosstalk cancellation systems for achieving the optimal acoustic effect. Besides, for canceling the crosstalk, the crosstalk cancellation systems require a huge computation and accordingly cannot provide the crosstalk cancellation in real time.

Therefore, it is desirable to provide an improved crosstalk cancellation system and method to mitigate and/or obviate the aforementioned problems.

SUMMARY OF THE INVENTION

An object of the invention is to provide a crosstalk cancellation system with sound quality preservation and the parameter determining method thereof, which can reduce the crosstalk amplification in low- and high-frequency bands and further overcome the high-frequency noises and distortion.

Another object of the invention is to provide a crosstalk cancellation system with sound quality preservation and the parameter determining method thereof, which can overcome the prior problem that the ipsilateral HRTF parts are over-compensated and thus avoid the reproduced field tone being changed.

A further object of the invention is to provide a crosstalk cancellation system with sound quality preservation and the parameter determining method thereof, which can overcome the problem of speaker dependency and thereby achieve the optimal effect.

In accordance with one aspect of the present invention, there is provided a parameter determining method, which is applied to a crosstalk cancellation system with sound quality preservation. The crosstalk cancellation system with sound quality preservation cancels a crosstalk produced when an audio signal is playing. The parameter determining method includes: (A) providing an audio signal input device for inputting a two-channel audio signal; (B) modeling a relation between parameters of the crosstalk cancellation system and a head related transfer function (HRTF) to thereby obtain an output transfer impulse response; (C) setting contralateral parts of the output transfer impulse response approximate to zero; (D) setting ipsilateral parts of the output transfer impulse response equal to a delay of ipsilateral head related impulse responses (HRIRs) corresponding to the HRTF; and (E) performing an inverse operation to compute the parameters of the crosstalk cancellation system.

In accordance with another aspect of the present invention, there is provided a parameter determining method, which is applied to a crosstalk cancellation system with sound quality preservation. The crosstalk cancellation system with sound quality preservation cancels a crosstalk produced when an audio signal is playing. The parameter determining method includes: (A) providing an audio signal input device for inputting a two-channel audio signal; (B) modeling a relation between parameters of the crosstalk cancellation system and a head related transfer function (HRTF) to thereby obtain an output transfer impulse response; (C) setting contralateral parts of the output transfer impulse response approximate to zero; (D) setting ipsilateral impulse parameters of the crosstalk cancellation system with sound quality preservation equal to a delayed impulse function; and (E) performing an inverse operation to compute the parameters of the crosstalk cancellation system.

In accordance with a further aspect of the present invention, there is provided a crosstalk cancellation system with sound quality preservation, which cancels all crosstalk produced when a two-channel audio signal is playing. The crosstalk cancellation system with sound quality preservation includes a first ipsilateral head filter, a second ipsilateral filter, a first contralateral head filter, a second contralateral head filter, a first adder and a second adder. The first ipsilateral head filter is connected to a left channel part of the two-channel audio signal in order to pass through the left channel audio signal and produce a first ipsilateral head filter signal. The second ipsilateral head filter is connected to a right channel part of the two-channel audio signal in order to pass through the right channel audio signal and produce a second ipsilateral head filter signal. The first contralateral head filter is connected to the left channel part of the two-channel audio signal in order to cancel a first contralateral crosstalk of the left channel audio signal and produce a first contralateral head filter signal. The second contralateral head filter is connected to the right channel part of the two-channel audio signal in order to cancel a second contralateral crosstalk of the right channel audio signal and produce a second contralateral head filter signal. The first adder is connected to the first ipsilateral head filter and the second contralateral head filter in order to add the first ipsilateral head filter signal and the second contralateral head filter signal to thereby produce a left channel output signal. The second adder is connected to the second ipsilateral head filter and the first contralateral head filter in order to add the second ipsilateral head filter signal and the first contralateral head filter signal to thereby produce a right channel output signal. The first ipsilateral head filter, the second ipsilateral head filter, the first contralateral head filter and the second contralateral head filter have parameters $C_{11}$, $C_{22}$, $C_{21}$ and $C_{12}$ respectively, and accordingly an equation for the system is given as follows:

$$\begin{bmatrix} z^{-\Delta}H_{11} & 0 \\ 0 & z^{-\Delta}H_{22} \end{bmatrix} = \begin{bmatrix} H_{11} & H_{12} \\ H_{21} & H_{22} \end{bmatrix} \begin{bmatrix} C_{11} & C_{12} \\ C_{21} & C_{22} \end{bmatrix},$$

where $H_{11}$ and $H_{22}$ are an ipsilateral head related transfer function (HRTF) respectively, $H_{21}$ and $H_{12}$ are a contralateral HRTF respectively, and $\Delta$ is a predetermined delay.

In accordance with still a further aspect of the present invention, there is provided a crosstalk cancellation system with sound quality preservation, which cancels all crosstalk produced when a two-channel audio signal is playing. The crosstalk cancellation system with sound quality preservation includes a first ipsilateral head filter, a second ipsilateral filter, a first contralateral head filter, a second contralateral head filter, a first adder and a second adder. The first ipsilateral head filter is connected to a left channel part of the two-channel audio signal in order to pass through the left channel audio signal and produce a first ipsilateral head filter signal. The second ipsilateral head filter is connected to a right channel part of the two-channel audio signal in order to pass through the right channel audio signal and produce a second ipsilateral head filter signal. The first contralateral head filter is connected to the left channel part of the two-channel audio signal in order to cancel a first contralateral crosstalk of the left channel audio signal and produce a first contralateral head filter signal. The second contralateral head filter is connected to the right channel part of the two-channel audio signal in order to cancel a second contralateral crosstalk of the right channel audio signal and produce a second contralateral head filter signal. The first adder is connected to the first ipsilateral head filter and the second contralateral head filter in order to add the first ipsilateral head filter signal and the second contralateral head filter signal to thereby produce a left channel output signal. The second adder is connected to the second ipsilateral head filter and the first contralateral head filter in order to add the second ipsilateral head filter signal and the first contralateral head filter signal to thereby produce a right channel output signal. The first ipsilateral head filter, the second ipsilateral head filter, the first contralateral head filter and the second contralateral head filter have parameters $C_{11}$, $C_{22}$, $C_{21}$ and $C_{12}$ respectively, and accordingly an equation set for the system is given as follows:

$$-z^{-\Delta}\tilde{H}_{12}=\tilde{H}_{11}C_{12},$$

$$-z^{-\Delta}\tilde{H}_{21}=\tilde{H}_{22}C_{21},$$

where $H_{11}$ and $H_{22}$ are an ipsilateral head related transfer function (HRTF) respectively, $H_{21}$ and $H_{12}$ are a contralateral HRTF respectively, and $\Delta$ is a predetermined delay.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
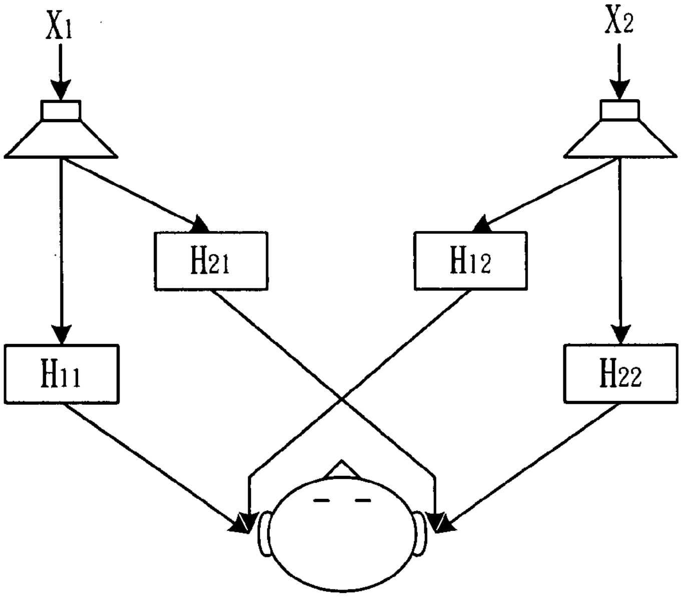
FIG. 1 Prior Art
FIG. 1 is a schematic view of a 3D sound reproduction over two channel speakers in the prior art.

Crosstalk cancellation systems play an important role when speakers are applied to reproduce a 3D sound. FIG. 1 is a schematic view of a 3D sound reproduction over two channel speakers in accordance with the prior art, where $X_1$ and $X_2$ indicate the input signals of left-channel and right-channel audio signals respectively, $H_{11}$ and $H_{22}$ indicate an ipsilateral head related transfer function (HRTF) respectively, and $H_{12}$ and $H_{21}$ indicate a contralateral HRTF respectively. As shown in FIG. 1, the input signals $X_1$ and $X_2$ are input to the respective blocks $H_{11}$ and $H_{22}$ through the left-channel and right-channel speakers, and the input signals $X_1$ and $X_2$ are input to the respective blocks $H_{12}$ and $H_{21}$ the outputs produced by the blocks $H_{21}$ and $H_{21}$ are the crosstalk to be canceled by the crosstalk cancellation system of the invention.

Figure 2:
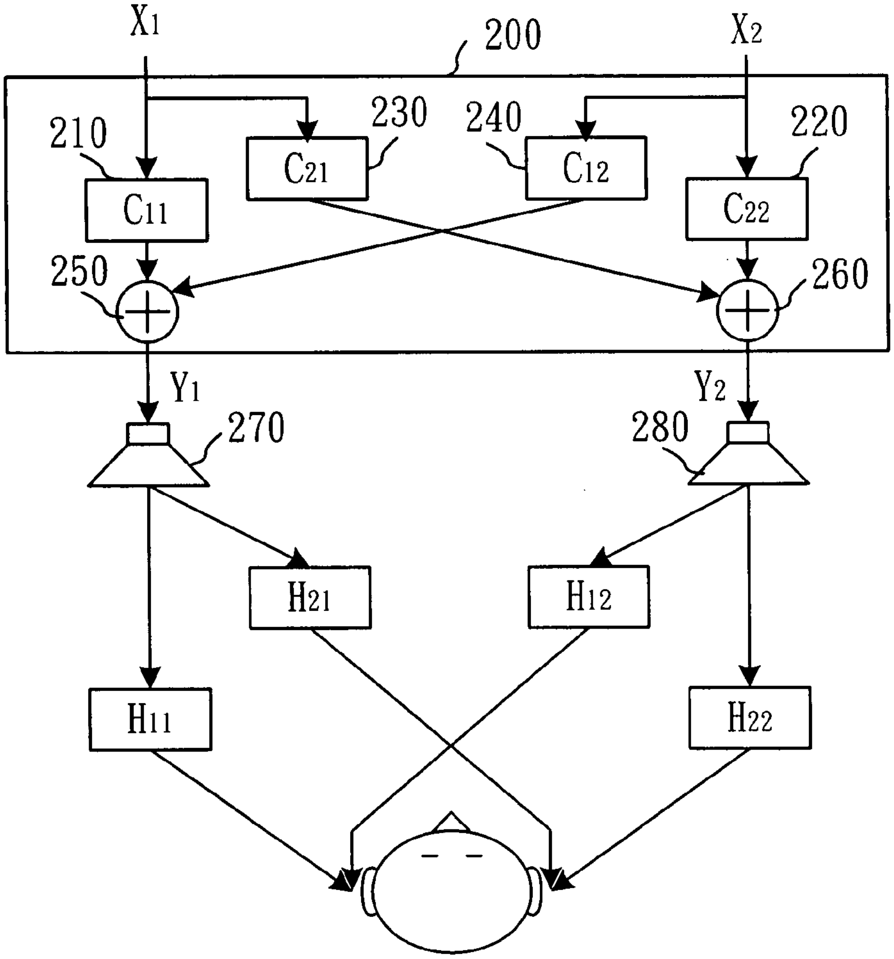
FIG. 2 is a schematic view of an application with a crosstalk cancellation system with sound quality preservation in accordance with the invention.

Namely, in order to cancel the crosstalk to improve a 3D field sound reproduction, the input signals require passing through a crosstalk cancellation system first. FIG. 2 is a schematic diagram of a crosstalk cancellation system 200 in accordance with the invention. In FIG. 2, the system 200 includes a first ipsilateral filter 210, a second ipsilateral filter 220, a first contralateral filter 230, a second contralateral filter 240, a first adder 250 and a second adder 260.

As shown in FIG. 2, the first ipsilateral filter 210 is connected to the left channel part $X_1$ of the two-channel audio signal in order to pass through the left channel audio signal $X_1$ to maintain the original field tone and accordingly produce a first ipsilateral head filter signal. The second ipsilateral head filter 220 is connected to the right channel part $X_2$ of the two-channel audio signal in order to pass through the right channel audio signal $X_2$ to maintain the original field tone and accordingly produce a second ipsilateral head filter signal.

The first contralateral head filter 230 is connected to the left channel audio signal $X_1$ in order to cancel the contralateral crosstalk of the left channel audio signal $X_1$ and accordingly produce a first contralateral head filter signal. The second contralateral head filter 240 is connected to the right channel audio signal $X_2$ in order to cancel the contralateral crosstalk of the right channel audio signal $X_2$ and accordingly produce a second contralateral head filter signal.

The first adder 250 is connected to the first ipsilateral head filter 210 and the second contralateral head filter 240 in order to add the first ipsilateral head filter signal and the second contralateral head filter signal to thereby produce a left channel output signal to drive a speaker 270.

The second adder 260 is connected to the second ipsilateral head filter 220 and the first contralateral head filter 230 in order to add the second ipsilateral head filter signal and the first contralateral head filter signal to thereby produce a right channel output signal to drive a speaker 280.

The invention provides a parameter determining method, which is applied to the crosstalk cancellation system 200 for determining the parameters to cancel the crosstalk without compensating the frequency responses of the ipsilateral HRTFs to thereby maintain the original field tone and achieve a better 3D sound reproduction.

Figure 3:
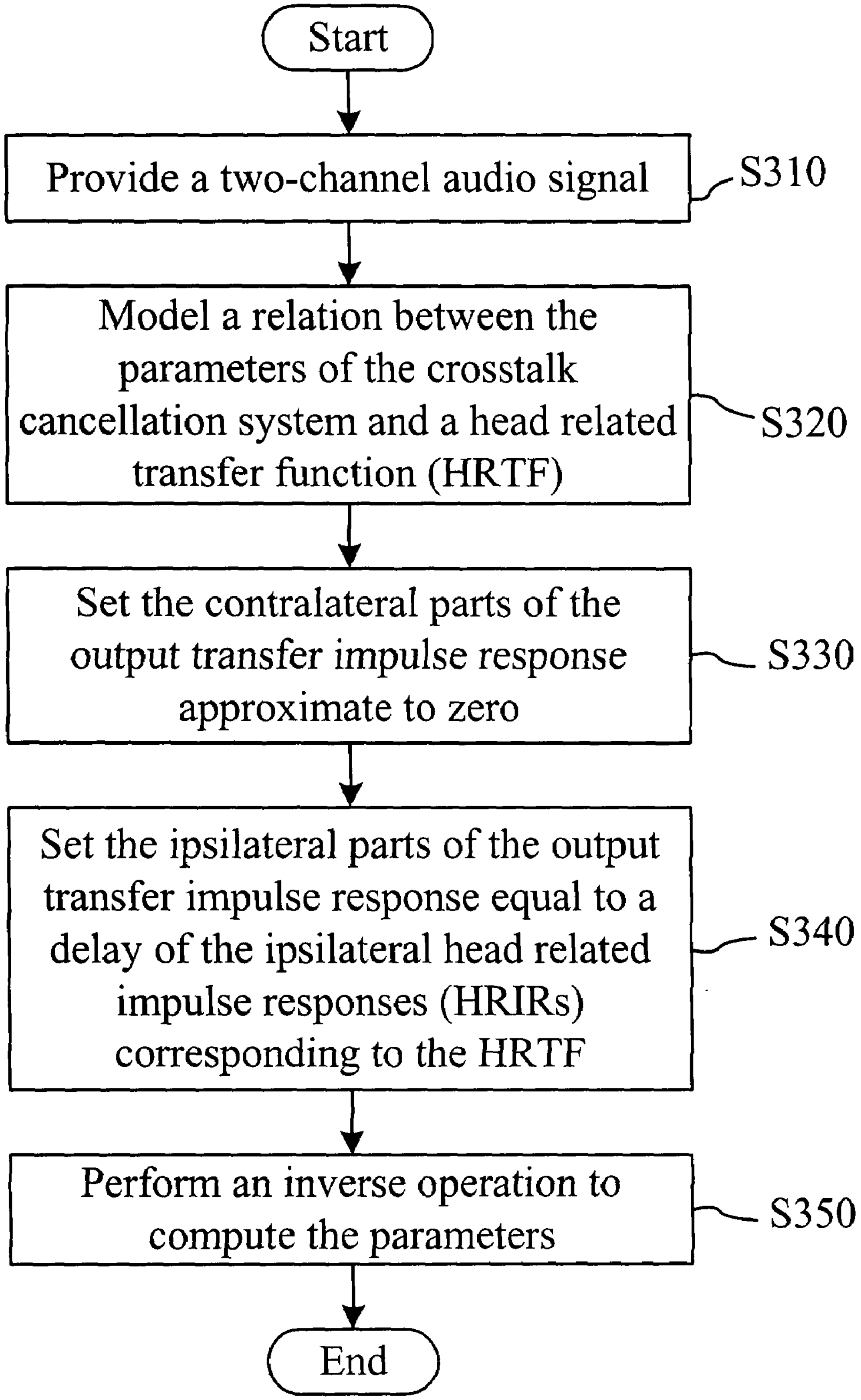
FIG. 3 is a flowchart of a parameter determining method for a crosstalk cancellation system with sound quality preservation in accordance with the invention.

FIG. 3 is a flowchart of a parameter determining method for the crosstalk cancellation system 200 for preserving quality of sound in accordance with the invention. As shown in FIGS. 2 and 3, the system 200 is located between the left-channel and right-channel audio signals $X_1$, $X_2$ and the left-channel and right-channel speakers 270, 280 in order to cancel the crosstalk produced when a two-channel audio signal ($X_1$, $X_2$) is playing, without compensating the frequency response of an ipsilateral HRTF. First, step S310 provides an audio signal input device for inputting a two-channel audio signal.

Step S320 models a relation between the parameters of the crosstalk cancellation system 200 and a head related transfer function (HRTF) to thereby obtain an output transfer impulse response. The relation between the parameters of the system 200 and the HRTF can be expressed in time domain by the following equation:

$$\begin{bmatrix} d_{11}(n) & d_{12}(n) \\ d_{21}(n) & d_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix} \quad (1)$$

where $c_{11}(n)$, $c_{22}(n)$, $c_{12}(n)$ and $c_{21}(n)$ denote the parameters of the system 200, $h_{11}(n)$ and $h_{22}(n)$ denote the ipsilateral head related impulse responses (HRIRs) corresponding to the HRTF, $h_{12}(n)$ and $h_{21}(n)$ denote the contralateral HRIRs corresponding to the HRTF, $d_{11}(n)$ and $d_{22}(n)$ denote the ipsilateral parts of the output transfer impulse response, $d_{12}(n)$ and $d_{21}(n)$ denote the contralateral parts of the output transfer impulse response, n denotes a time sampling point, and $\otimes$ denotes a convolution operation.

In the invention, in order to cancel the crosstalk, let $d_{12}(n)$ and $d_{21}(n)$ be a value $\gamma$ approximate to zero. Namely, step S330 sets the contralateral parts of the output transfer impulse response approximate to zero, which can be expressed by the following equation set:

$$\begin{cases} d_{12}(n) = \gamma \\ d_{21}(n) = \gamma \end{cases} \quad (2)$$

where $\gamma$ denotes a value approximate to zero. Accordingly, the relation between the parameters of the system 200 and the HRTF can be given as follows.

$$\begin{bmatrix} d_{11}(n) & \gamma \\ \gamma & d_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix} \quad (3)$$

In order to maintain the original field tone, let $d_{11}(n)$ and $d_{22}(n)$ be a delay of the original ipsilateral HRIRs. Namely, step S340 sets the ipsilateral parts of the output transfer impulse response equal to a delay of the ipsilateral HRIRs corresponding to the HRTF, which can be expressed by the following equation set:

$$d_{11}(n) = \delta(n-\Delta) \otimes h_{11}(n)$$

$$d_{22}(n) = \delta(n-\Delta) \otimes h_{22}(n) \quad (4)$$

where $\delta(n)$ denotes an impulse function, and $\Delta$ denotes a predetermined delay. Accordingly, the relation between the parameters of the system 200 and the HRTF can be given as follows.

$$\begin{bmatrix} \delta(n-\Delta) \otimes h_{11}(n) & \gamma \\ \gamma & \delta(n-\Delta) \otimes h_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix} \quad (5)$$

Step S350 performs an inverse operation on equation (5) to compute the parameters of the system 200.

Equation (5) is converted from time to frequency domain. Accordingly, the relation between the parameters of the system 200 and the HRTF can be given as follows.

$$\begin{bmatrix} z^{-\Delta}\tilde{H}_{11}S_1 & 0 \\ 0 & z^{-\Delta}\tilde{H}_{22}S_2 \end{bmatrix} = \begin{bmatrix} \tilde{H}_{11}S_1 & \tilde{H}_{12}S_2 \\ \tilde{H}_{21}S_1 & \tilde{H}_{22}S_2 \end{bmatrix} \begin{bmatrix} C_{11} & C_{12} \\ C_{21} & C_{22} \end{bmatrix} \quad (6)$$

where $S_1$ and $S_2$ denote the frequency responses respectively of the speakers 270 and 280, $\tilde{H}_{11}$, $\tilde{H}_{22}$, $\tilde{H}_{12}$ and $\tilde{H}_{21}$ denote the HRTFs without the speaker response, and the effect of $\gamma$ is omitted.

If the speakers 270 and 280 have the same frequency response when the speaker response is further considered, i.e., $S_1=S_2=S$, equation (6) can be given as follows.

$$S\begin{bmatrix} z^{-\Delta}\tilde{H}_{11} & 0 \\ 0 & z^{-\Delta}\tilde{H}_{22} \end{bmatrix} = S\begin{bmatrix} \tilde{H}_{11} & \tilde{H}_{12} \\ \tilde{H}_{21} & \tilde{H}_{22} \end{bmatrix} \begin{bmatrix} C_{11} & C_{12} \\ C_{21} & C_{22} \end{bmatrix}. \quad (6')$$

From equation (6'), it is known that the frequency response of the speakers 270 and 280 can be omitted. Thus, the parameter determining method of the invention can obtain the parameters of the system 200 with the feature independent on the character of speaker.

Figure 4:
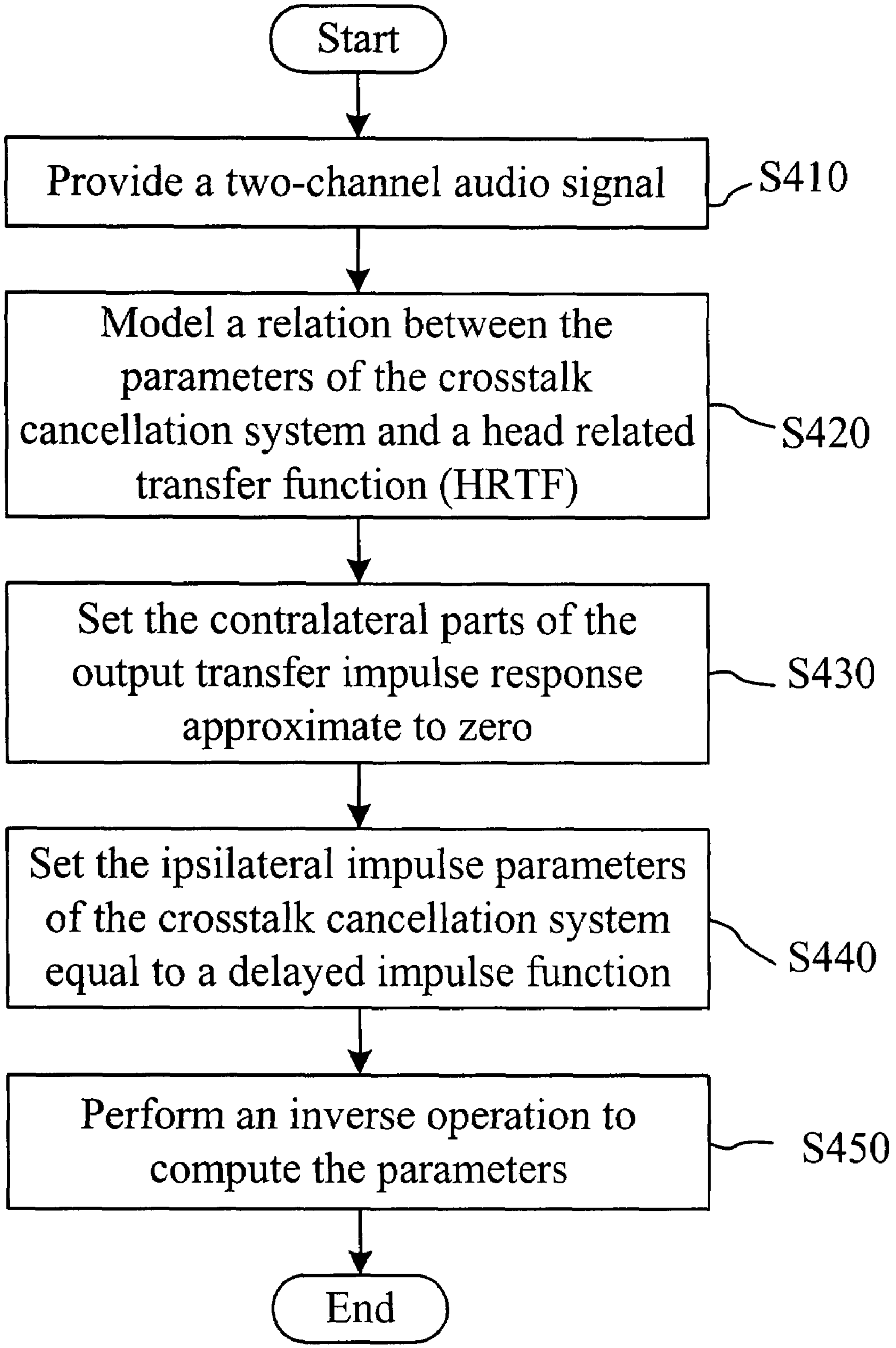
FIG. 4 is a flowchart of another parameter determining method for a crosstalk cancellation system with sound quality preservation in accordance with the invention.

FIG. 4 is a flowchart of another parameter determining method for a crosstalk cancellation system with sound quality preservation in accordance with the invention. As shown in FIG. 4, step S410 provides an audio signal input device for inputting a two-channel audio signal.

Step S420 models a relation between parameters of the crosstalk cancellation system 200 and a head related transfer function (HRTF) to thereby obtain an output transfer impulse response. The relation between the parameters of the system 200 and the HRTF can be expressed in time domain by the following equation:

$$\begin{bmatrix} d_{11}(n) & d_{12}(n) \\ d_{21}(n) & d_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix} \quad (7)$$

where $c_{11}(n)$, $c_{22}(n)$, $c_{12}(n)$ and $c_{21}(n)$ denote the parameters of the system 200, $h_{11}(n)$ and $h_{22}(n)$ denote the ipsilateral head related impulse responses (HRIRs) corresponding to the HRTF, $h_{12}(n)$ and $h_{21}(n)$ denote the contralateral HRIRs corresponding to the HRTF, $d_{11}(n)$ and $d_{22}(n)$ denote the ipsilateral parts of the output transfer impulse response, $d_{12}(n)$ and $d_{21}(n)$ denote the contralateral parts of the output transfer impulse response, n denotes a time sampling point, and $\otimes$ denotes a convolution operation.

In the invention, in order to cancel the crosstalk, let $d_{12}(n)$ and $d_{21}(n)$ be a value $\gamma$ approximate to zero. Namely, step S430 sets the contralateral parts of the output transfer impulse response approximate to zero, which can be expressed by the following equation set:

$$\begin{cases} d_{12}(n) = \gamma \\ d_{21}(n) = \gamma \end{cases} \tag{8}$$

where $\gamma$ denotes a value approximate to zero. Accordingly, the relation between the parameters of the system 200 and the HRTF can be given as follows:

$$\begin{bmatrix} d_{11}(n) & \gamma \\ \gamma & d_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix} \tag{9}$$

In order to maintain the original field tone, the ipsilateral impulse parameters of the system 200 are set to be equal to a delayed impulse function. Namely, let $c_{11}(n)$ and $c_{22}(n)$ be the delayed impulse function. Accordingly, step S440 sets the ipsilateral impulse parameters of the system 200 equal to the delayed impulse function, which can be expressed by the following equation set:

$$\begin{cases} c_{11}(n) = \delta(n-\Delta) \\ c_{22}(n) = \delta(n-\Delta) \end{cases} \tag{10}$$

where $\delta(n)$ denotes an impulse function, and $\Delta$ denotes a predetermined delay. Accordingly, the relation between the parameters of the system 200 and the HRTF can be given as follows.

$$\begin{bmatrix} d_{11}(n) & \gamma \\ \gamma & d_{22}(n) \end{bmatrix} = \begin{bmatrix} h_{11}(n) & h_{12}(n) \\ h_{21}(n) & h_{22}(n) \end{bmatrix} \otimes \begin{bmatrix} \delta(n-\Delta) & c_{12}(n) \\ c_{21}(n) & \delta(n-\Delta) \end{bmatrix} \tag{11}$$

Step S450 performs an inverse operation on equation (11) to compute the parameters of the system 200. In this case, equation (11) is rewritten as follows:

$$-h_{12}(n)\otimes\delta(n-\Delta)=h_{11}(n)\otimes c_{12}(n)$$

$$-h_{21}(n)\otimes\delta(n-\Delta)=h_{22}(n)\otimes c_{21}(n) \tag{11'}$$

Equation (11') is converted from time to frequency domain. Accordingly, the relation between the parameters of the system 200 and the HRTF can be given as follows:

$$\begin{cases} -z^{-\Delta}\tilde{H}_{12}S_1 = S_1\tilde{H}_{11}C_{12} \\ -z^{-\Delta}\tilde{H}_{21}S_1 = S_2\tilde{H}_{22}C_{21} \end{cases} \tag{12}$$

where $S_1$ and $S_2$ denote the frequency responses respectively of the speakers 270 and 280, $\tilde{H}_{11}$, $\tilde{H}_{22}$, $\tilde{H}_{12}$ and $\tilde{H}_{21}$ denotes the HRTF without the speaker response, and the effect of $\gamma$ is omitted.

If the speakers 270 and 280 have the same frequency response when the speaker response is further considered, i.e., $S_1=S_2=S$, equation (12) can be rewritten as follows:

$$\begin{cases} -z^{-\Delta}\tilde{H}_{12}S = \tilde{H}_{11}SC_{12} \\ -z^{-\Delta}\tilde{H}_{21}S = \tilde{H}_{22}SC_{21} \end{cases} \tag{12'}$$

From equation (12'), it is known that the frequency response of the speakers 270 and 280 can be omitted. Thus, the parameter determining method of the invention can obtain the parameters of the system 200 with the feature independent on the character of speaker.

Figure 5:
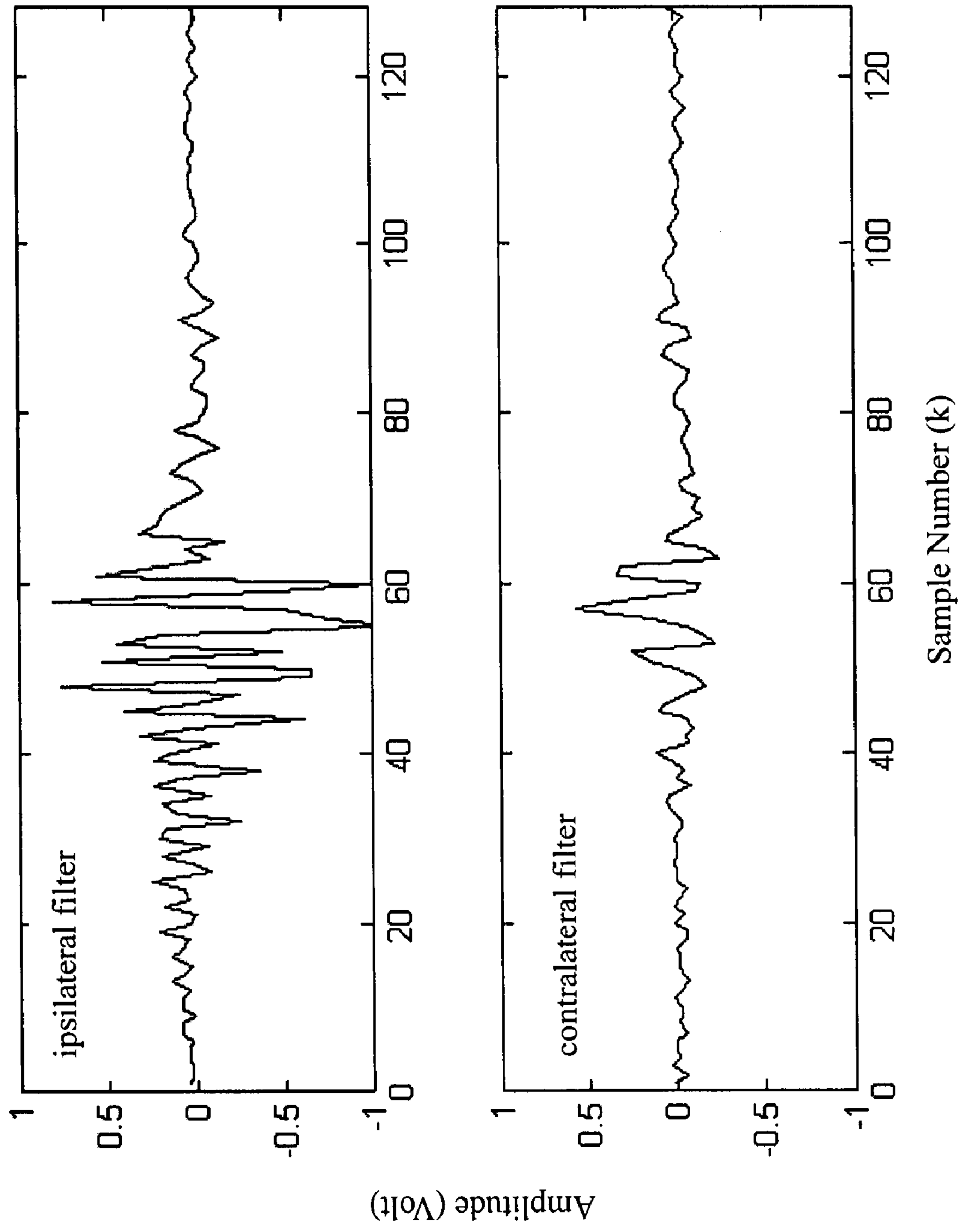
FIG. 5 Prior Art
FIG. 5 is a schematic graph of the impulse responses of ipsilateral and contralateral crosstalk cancellation filters in the prior art.
Figure 6:
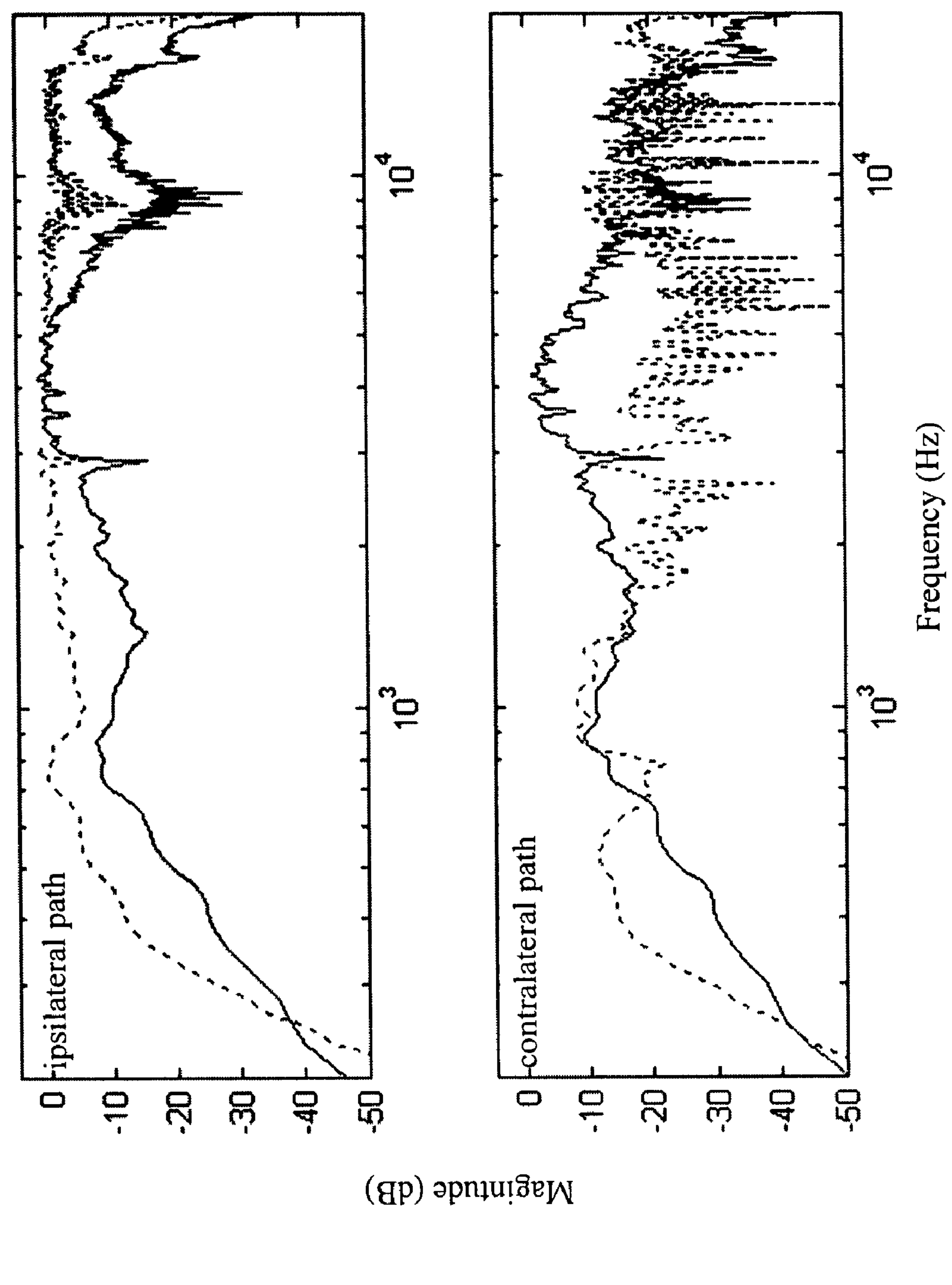
FIG. 6 Prior Art
FIG. 6 is a comparative graph of the frequency responses, before and after the processing of ipsilateral and contralateral crosstalk cancellation system in the prior art.
Figure 7:
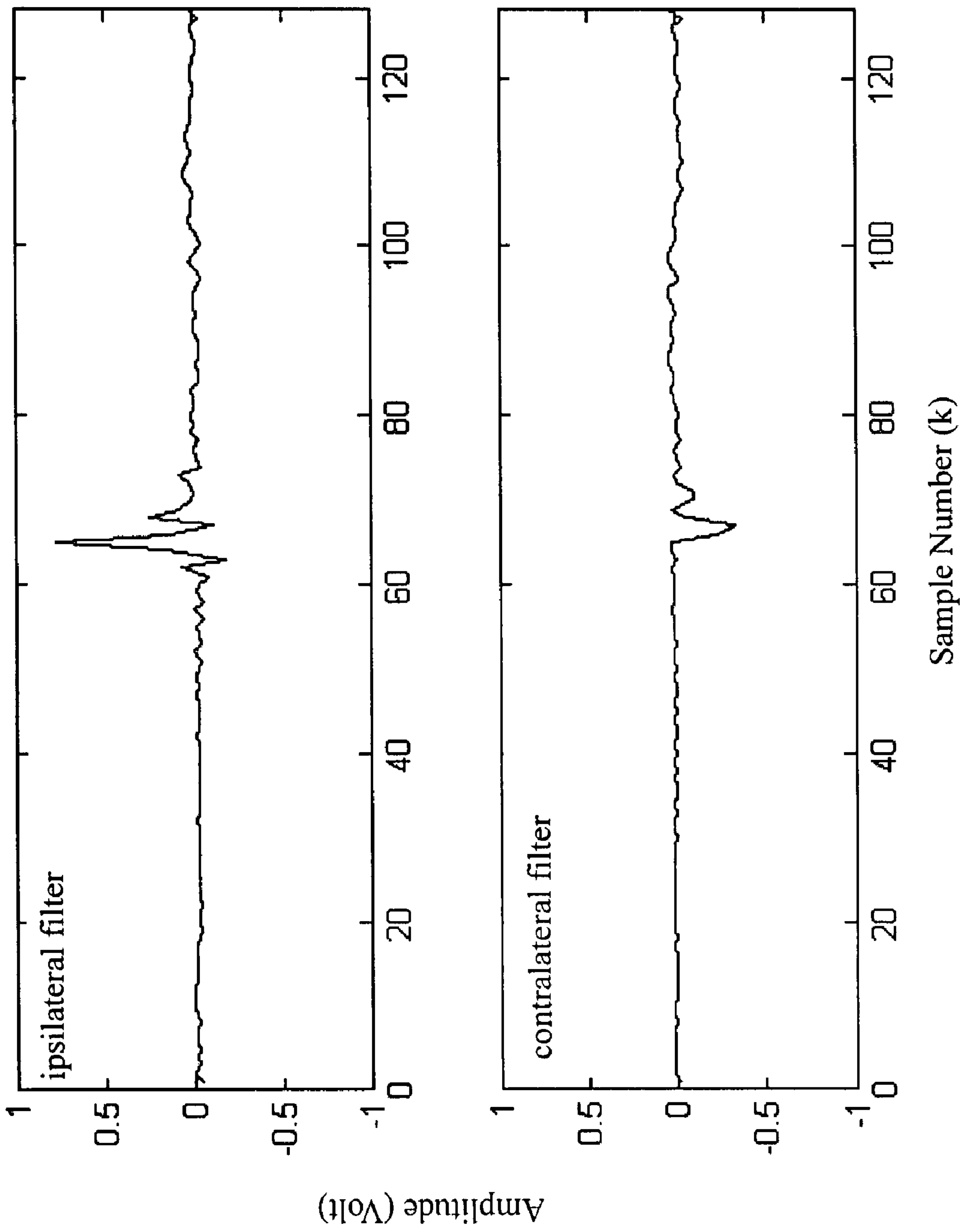
FIG. 7 is a schematic graph of the impulse responses of ipsilateral and contralateral crosstalk cancellation filters in accordance with an embodiment of the invention.
Figure 8:
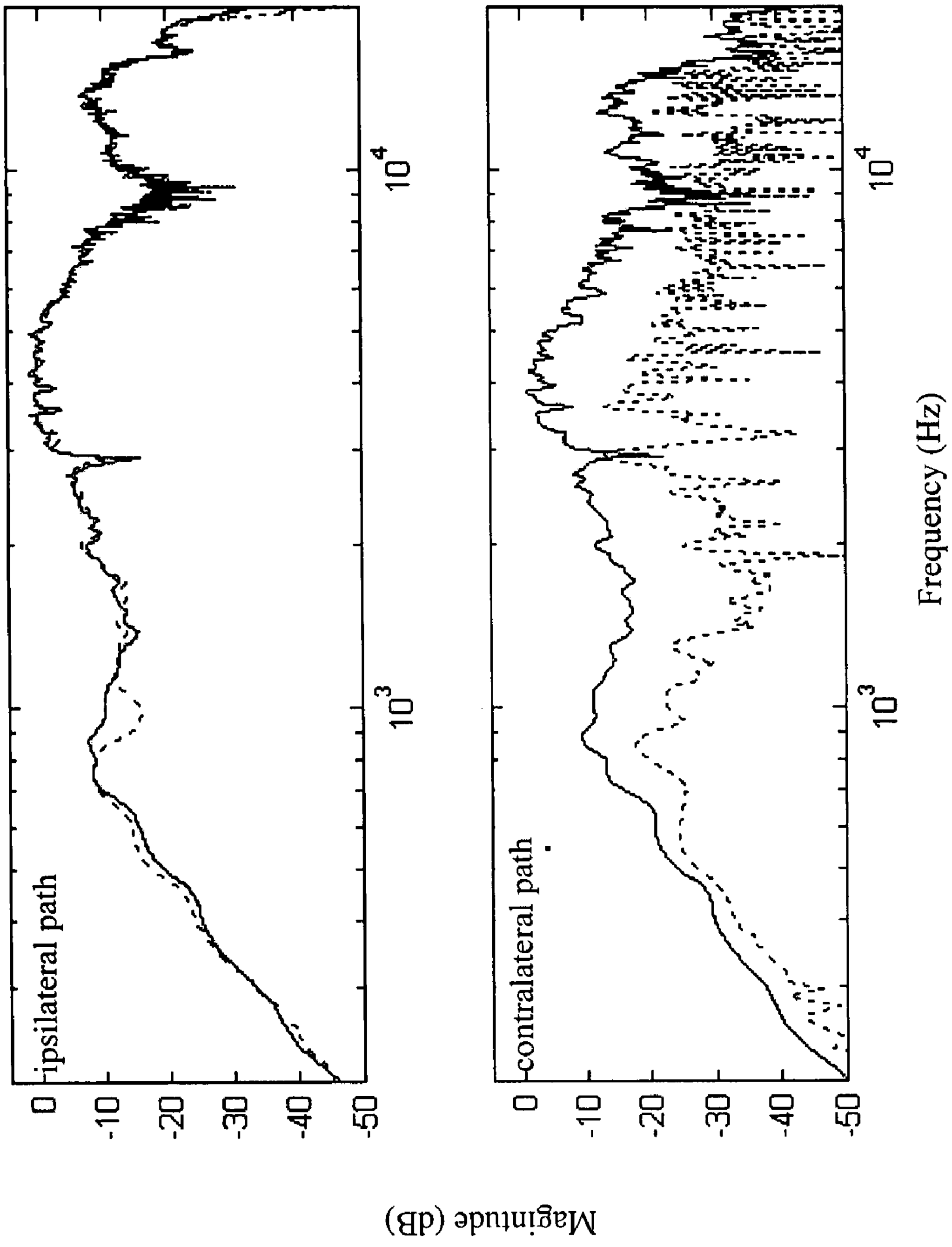
FIG. 8 is a comparative graph of the field frequency responses, before and after the processing of ipsilateral and contralateral crosstalk cancellation system in accordance with an embodiment of the invention.
Figure 9:
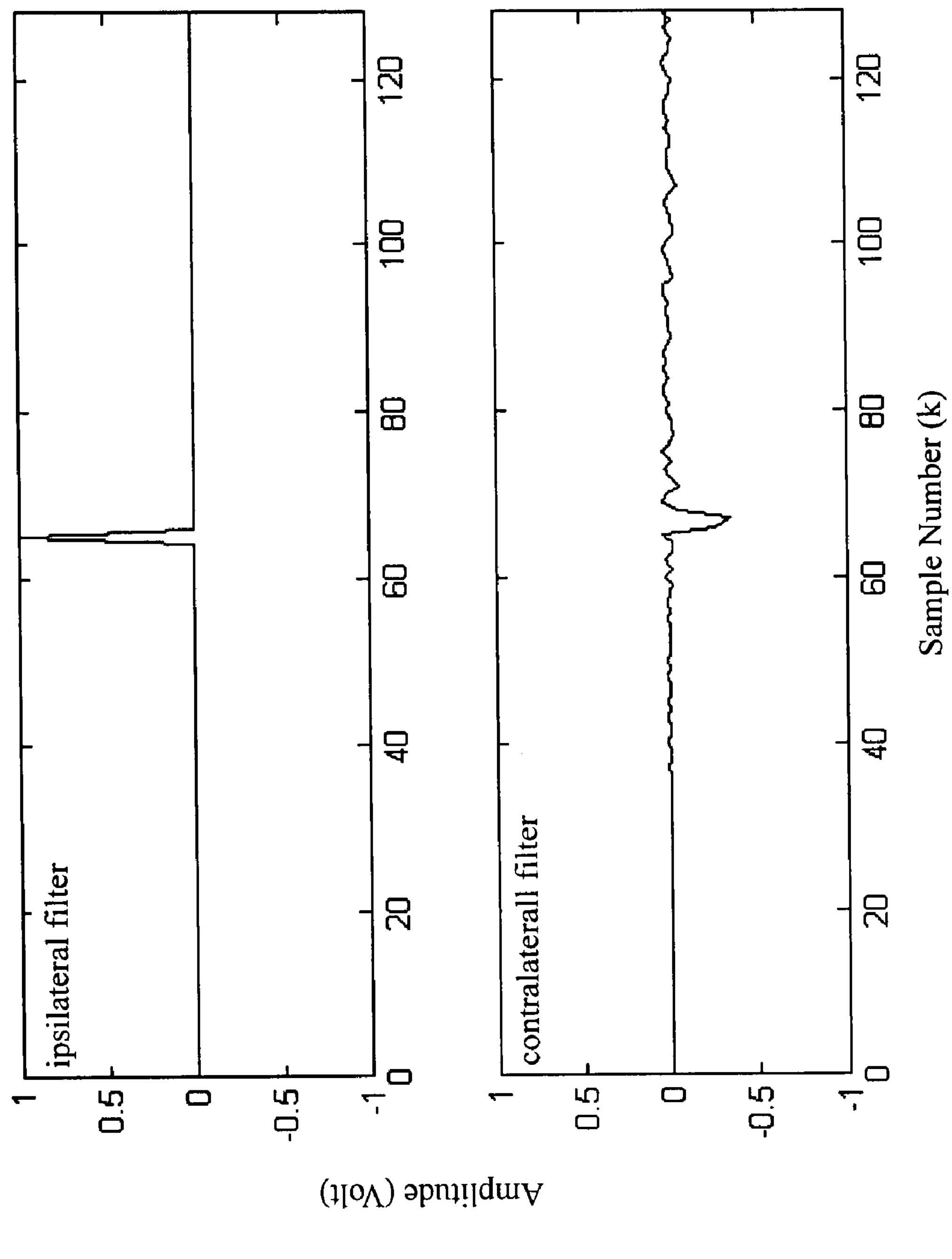
FIG. 9 is a schematic graph of the impulse responses of ipsilateral and contralateral crosstalk cancellation filters in accordance with another embodiment of the invention.
Figure 10:
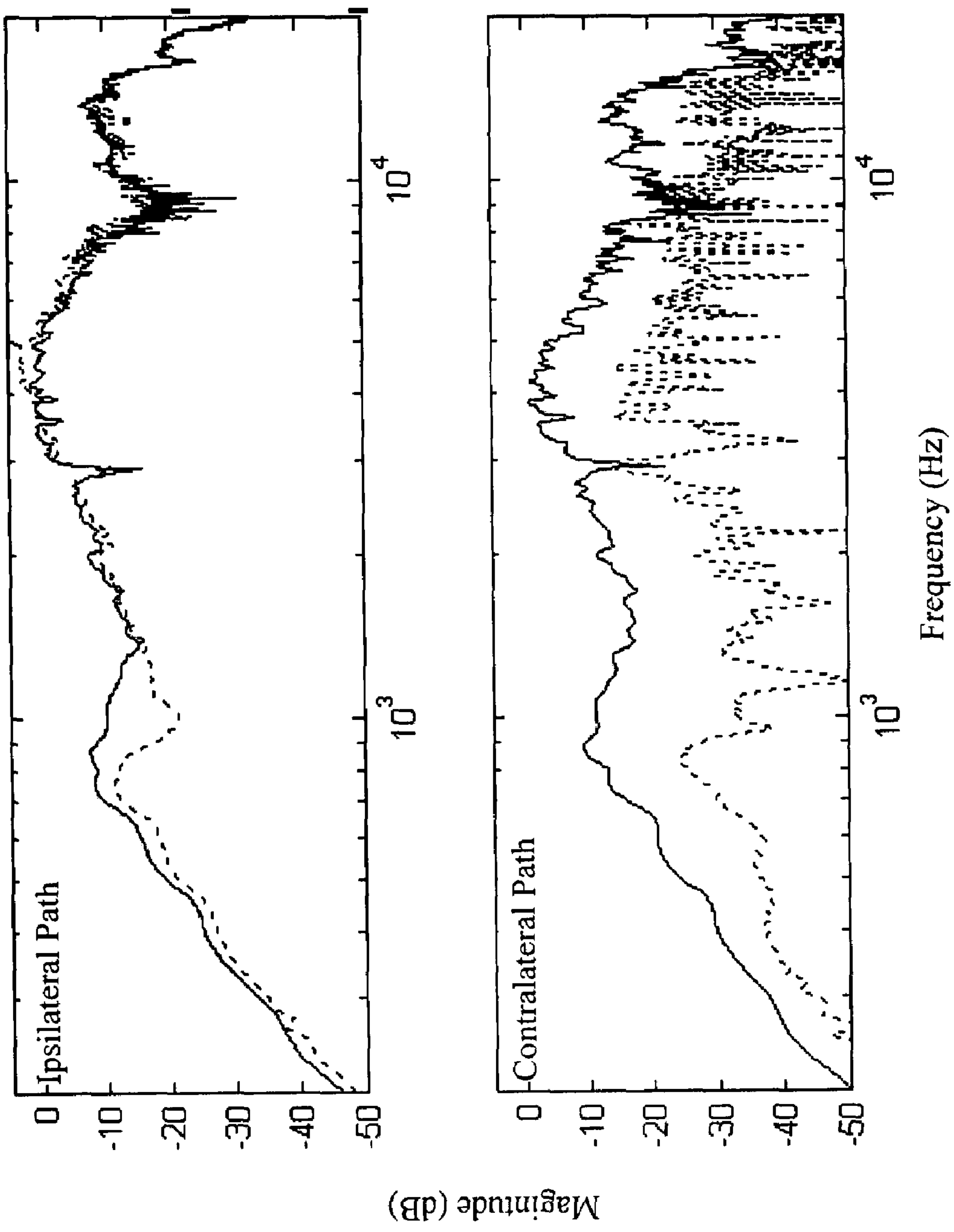
FIG. 10 is a comparative graph of the field frequency responses, before and after the processing of ipsilateral and contralateral crosstalk cancellation system in accordance with another embodiment of the invention.

The invention is superior to the prior art, as shown in FIGS. 5-10. FIG. 5 shows a schematic graph of the impulse responses of ipsilateral and contralateral crosstalk cancellation filters in the prior art. FIG. 6 shows a comparative graph of the acoustics frequency responses, before and after the processing of ipsilateral and contralateral crosstalk cancellation system in the prior art, where the solid lines indicate the acoustics frequency response before the processing and the dotted lines indicate the acoustics frequency response after the processing. FIG. 7 shows a schematic graph of the impulse responses of ipsilateral and contralateral crosstalk cancellation filters in accordance with an embodiment of the invention. FIG. 8 shows a comparative graph of the acoustics frequency responses, before and after the processing of ipsilateral and contralateral crosstalk cancellation system in accordance with an embodiment of the invention. FIG. 9 shows a schematic graph of the impulse responses of ipsilateral and contralateral crosstalk cancellation filters in accordance with another embodiment of the invention. FIG. 10 shows a comparative graph of the acoustics frequency responses, before and after the processing of ipsilateral and contralateral crosstalk cancellation system in accordance with another embodiment of the invention.

In view of the foregoing, it is known that the parameters of the crosstalk cancellation system obtained by the parameter determining method of the invention can reduce the crosstalk and the effect of crosstalk amplification at a high frequency band or low frequency band. Thus, the high frequency noises or distortion can be eliminated effectively. In addition, the reproduced audible acoustic can maintain the original ipsilateral frequency responses, and accordingly the acoustic tone controlled by the crosstalk cancellation system of the invention is not changed significantly. Further, the crosstalk cancellation system configured by the parameter determining method is simple, which relatively reduces the computation and improves the implementation problem in real time. Furthermore, when the speakers have the same frequency response, the crosstalk cancellation system of the invention can have the feature independent on the character of speaker.

Although the present invention has been explained in relation to its preferred embodiment, it is to be understood that many other possible modifications and variations can be made without departing from the spirit and scope of the invention as hereinafter claimed.

What is claimed is:

1. A parameter determining method applied to a crosstalk cancellation system for preserving quality of sound, the method comprising the steps of:

(A) providing an audio signal input device for inputting a two-channel audio signal;

(B) modeling a relation between parameters of the crosstalk cancellation system and a head related transfer function (HRTF) to thereby obtain an output transfer impulse response, wherein the HRTF contains contralateral and ipsilateral head related impulse responses (HR- IRs), and the output transfer impulse response contains contralateral and ipsilateral output transfer impulse responses;

(C) setting the contralateral output transfer impulse responses to a value approximate to zero;

(D) delaying the ipsilateral head related impulse responses (HRIRs) to form the ipsilateral output transfer impulse responses so as to maintain an original field tone and further preserve the quality of sound; and (E) performing an inverse operation to compute the parameters of the crosstalk cancellation system.

2. The method as claimed in claim 1, wherein in step (B) the relation between the parameters of the crosstalk cancellation system and the head related transfer function (HRTF) is expressed by $$\begin{bmatrix} d_{11}(n) & d_{12}(n) \\ d_{21}(n) & d_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix},$$

where $d_{11}(n)$ and $d_{22}(n)$ denote the ipsilateral output transfer impulse responses, $d_{12}(n)$ and $d_{21}(n)$ denote the contralateral output transfer impulse responses, $h_{11}(n)$ and $h_{22}(n)$ denote the ipsilateral head related impulse responses (HRIRs), $h_{12}(n)$ and $h_{21}(n)$ denote the contralateral HRIRs, n denotes a time sampling point, $c_{11}(n)$, $c_{22}(n)$, $c_{12}(n)$ and $c_{21}(n)$ respectively denote a parameter of the crosstalk cancellation system with sound quality preservation , and $\otimes$ denotes a convolution operation.

3. The method as claimed in claim 2, wherein the step (C) of setting the contralateral output transfer impulse responses to a value approximate to zero is expressed by $$d_{12}(n)=\gamma,$$

$$d_{21}(n)=\gamma,$$

where γ is the value approximate to zero.

4. The method as claimed in claim 3, wherein the step (D) of delaying ipsilateral head related impulse responses (HRIRs) is expressed by $$d_{11}(n)=\delta(n-\Delta)\otimes h_{11}(n),$$

$$d_{22}(n)=\delta(n-\Delta)\otimes h_{22}(n),$$

where δ(n) is an impulse function, and Δ is a predetermined delay.

5. The method as claimed in claim 4, wherein in step (E) the inverse operation is performed on the following equation:

$$\begin{bmatrix} \delta(n-\Delta)\otimes h_{11}(n) & \gamma \\ \gamma & \delta(n-\Delta)\otimes h_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix}.$$

6. The method as claimed in claim 5, wherein the step (D) delays the ipsilateral head related impulse responses (HRIRs) to form the ipsilateral output transfer impulse responses without compensating a frequency response of an ipsilateral HRTF.

7. A parameter determining method applied to a crosstalk cancellation system for preserving quality of sound, the method comprising the steps of:

(A) providing an audio signal input device for inputting a two-channel audio signal;

(B) modeling a relation between parameters of the crosstalk cancellation system and a head related transfer function (HRTF) to thereby obtain an output transfer impulse response, wherein the HRTF contains contralateral and ipsilateral head related impulse responses (HRIRs), and the output transfer impulse response contains contralateral and ipsilateral output transfer impulse responses;

(C) setting the contralateral output transfer impulse responses to be a value approximate to zero;

(D) assigning ipsilateral parameters of the crosstalk cancellation system as a function of delay of an impulse function for preserving quality of sound; and (E) performing an inverse operation to compute the parameters of the crosstalk cancellation system.

8. The method as claimed in claim 7, wherein in step (B) the relation between the parameters of the crosstalk cancellation system and the head related transfer function (HRTF) is expressed by:

$$\begin{bmatrix} d_{11}(n) & d_{12}(n) \\ d_{21}(n) & d_{22}(n) \end{bmatrix} = \begin{bmatrix} h_{11}(n) & h_{12}(n) \\ h_{21}(n) & h_{22}(n) \end{bmatrix} \otimes \begin{bmatrix} c_{11}(n) & c_{12}(n) \\ c_{21}(n) & c_{22}(n) \end{bmatrix},$$

where $d_{11}(n)$ and $d_{22}(n)$ denote the ipsilateral output transfer impulse responses, $d_{12}(n)$ and $d_{21}(n)$ denote the contralateral output transfer impulse responses, $h_{11}(n)$ and $h_{22}$ (n) denote the ipsilateral head related impulse responses (HRIRs), $h_{12}(n)$ and $h_{21}(n)$ denote the contralateral HRIRs, n denotes a time sampling point, $c_{11}(n)$ and $c_{22}$ (n) denote the ipsilateral parameters of the crosstalk cancellation system, $c_{12}(n)$ and $c_{21}(n)$ denote contralateral parameters of the crosstalk cancellation system, and $\otimes$ denotes a convolution operation.

9. The method as claimed in claim 8, wherein the step (C) of setting contralateral output transfer impulse responses to be a value approximate to zero is expressed by $$d_{12}(n)=\gamma,$$

$$d_{21}(n)=\gamma,$$

where γ is the value approximate to zero.

10. The method as claimed in claim 9, wherein the step (D) of assigning ipsilateral parameters of the crosstalk cancellation system as a function of delay of an impulse function is expressed by $$c_{11}(n)=\delta(n-\Delta),$$

$$c_{22}(n)=\delta(n-\Delta),$$

where δ(n) is the impulse function, and Δ is a predetermined delay.

11. The method as claimed in claim 10, wherein in step (E) the inverse operation is performed on the following equation:

$$\begin{bmatrix} d_{11}(n) & \gamma \\ \gamma & d_{22}(n) \end{bmatrix} = \begin{bmatrix} h_{11}(n) & h_{12}(n) \\ h_{21}(n) & h_{22}(n) \end{bmatrix} \otimes \begin{bmatrix} \delta(n-\Delta) & c_{12}(n) \\ c_{21}(n) & \delta(n-\Delta) \end{bmatrix}.$$

12. The method as claimed in claim 11, wherein the step (D) assigns the ipsilateral parameters of the crosstalk cancellation system as a function of delay of the impulse function without compensating a frequency response of an ipsilateral HRTF.

13. A crosstalk cancellation system with sound quality preservation, the crosstalk cancellation system comprising:

a first ipsilateral head filter, connected to a left channel part of the two-channel audio signal, for passing through the left channel audio signal and producing a first ipsilateral head filter signal;

a second ipsilateral head filter, connected to a right channel part of the two-channel audio signal, for passing through the right channel audio signal and producing a second ipsilateral head filter signal;

a first contralateral head filter, connected to the left channel part of the two-channel audio signal, for canceling a first contralateral crosstalk of the left channel audio signal and producing a first contralateral head filter signal;

a second contralateral head filter, connected to the right channel part of the two-channel audio signal, for canceling a second contralateral crosstalk of the right channel audio signal and producing a second contralateral head filter signal;

a first adder, connected to the first ipsilateral head filter and the second contralateral head filter, for adding the first ipsilateral head filter signal and the second contralateral head filter signal to thereby produce a left channel output signal; and a second adder, connected to the second ipsilateral head filter and the first contralateral head filter, for adding the second ipsilateral head filter signal and the first contralateral head filter signal to thereby produce a right channel output signal;

wherein the first ipsilateral head filter has a parameter of C11, the second ipsilateral head filter has a parameter of C22, the first contralateral head filter has a parameter of C21, the second contralateral head filter has a parameter of C12, and a relation between parameters of the crosstalk cancellation system and a head related transfer function (HRTF) in frequency domain is expressed by:

$$\begin{bmatrix} z^{-\Delta}H_{11} & 0 \\ 0 & z^{-\Delta}H_{22} \end{bmatrix} = \begin{bmatrix} H_{11} & H_{12} \\ H_{21} & H_{22} \end{bmatrix} \begin{bmatrix} C_{11} & C_{12} \\ C_{21} & C_{22} \end{bmatrix},$$

where $H_{11}$ and $H_{22}$ are ipsilateral parameters of the head related transfer function (HRTF), $H_{21}$ and $H_{12}$ are contralateral parameters of the HRTF, and Δ is a predetermined delay.

14. A crosstalk cancellation system with sound quality preservation, the crosstalk cancellation system comprising:

a first ipsilateral head filter, connected to a left channel part of the two-channel audio signal, for passing through the left channel audio signal and producing a first ipsilateral head filter signal;

a second ipsilateral head filter, connected to a right channel part of the two-channel audio signal, for passing through the right channel audio signal and producing a second ipsilateral head filter signal;

a first contralateral head filter, connected to the left channel part of the two-channel audio signal, for canceling a first contralateral crosstalk of the left channel audio signal and producing a first contralateral head filter signal;

a second contralateral head filter, connected to the right channel part of the two-channel audio signal, for canceling a second contralateral crosstalk of the right channel audio signal and producing a second contralateral head filter signal;

a first adder, connected to the first ipsilateral head filter and the second contralateral head filter, for adding the first ipsilateral head filter signal and the second contralateral head filter signal to thereby produce a left channel output signal; and a second adder, connected to the second ipsilateral head filter and the first contralateral head filter, for adding the second ipsilateral head filter signal and the first contralateral head filter signal to thereby produce a right channel output signal;

wherein the first ipsilateral head filter has a parameter of C11, the second ipsilateral head filter has a parameter of C22, the first contralateral head filter has a parameter of C21, the second contralateral head filter has a parameter of C12, and a relation between parameters of the crosstalk cancellation system and a head related transfer function (HRTF) in frequency domain is expressed by:

$$-z^{-\Delta}\tilde{H}_{12}=\tilde{H}_{11}C_{12},$$

$$-z^{-\Delta}\tilde{H}_{21}=\tilde{H}_{22}C_{21}$$

where $H_{11}$ and $H_{22}$ are ipsilateral parameters of the head related transfer function (HRTF), $H_{21}$ and $H_{12}$ are contralateral parameters of the HRTF, and Δ is a predetermined delay.

* * * * *